United States Patent [19]

Tsuruoka et al.

[11] Patent Number: 4,985,648

[45] Date of Patent: Jan. 15, 1991

[54] SWITCHING OUTPUT CIRCUIT WITH HIGH SPEED OPERATION AND LOW POWER CONSUMPTION

[75] Inventors: Toshiaki Tsuruoka; Masafumi Nakamura, both of Tsu; Shintaro Mori, Itami, all of Japan

[73] Assignees: Matsushita Electric Industrial Co. Ltd., Kadoma; Mitsubishi Denki Kabushiki Kaisha, Tokyo, both of Japan

[21] Appl. No.: 386,356

[22] Filed: Jul. 18, 1989

[30] Foreign Application Priority Data

Jul. 26, 1988 [JP] Japan ................................. 63-187692
May 19, 1989 [JP] Japan ................................. 1-127155

[51] Int. Cl.⁵ ........................................ H03K 19/088
[52] U.S. Cl. ................................ 307/456; 307/443; 357/34
[58] Field of Search .................. 307/443, 454, 456; 357/34, 42

[56] References Cited

U.S. PATENT DOCUMENTS

| | | | |
|---|---|---|---|
| 3,641,368 | 2/1972 | Gamble et al. | 307/456 |
| 4,339,676 | 7/1982 | Ramsey | 307/456 |
| 4,454,432 | 6/1984 | Wood | 307/456 |
| 4,467,223 | 8/1984 | Neely | 307/456 |
| 4,476,403 | 10/1984 | Allen | 307/443 |
| 4,514,651 | 4/1985 | Miller et al. | 307/456 |
| 4,585,959 | 4/1986 | Baskett et al. | 307/443 |
| 4,591,741 | 4/1986 | Cooper | 307/443 |
| 4,745,308 | 3/1988 | Neely | 307/443 |
| 4,857,776 | 8/1989 | Khan | 307/443 |
| 4,912,054 | 3/1990 | Tomassetti | 357/43 |

FOREIGN PATENT DOCUMENTS

| | | | |
|---|---|---|---|
| 0099824 | 6/1982 | Japan | 307/456 |
| 0077218 | 4/1988 | Japan | 307/456 |
| 0106521 | 4/1989 | Japan | 307/454 |

OTHER PUBLICATIONS

IBM Technical Disclosure Bulletin–"High Speed Bipolar Push–Pull circuit", 12/86.
IBM Technical Disclosure Bulletin–"Active Pull Down For Current–Controlled Gate", 4/82.

*Primary Examiner*—Stanley D. Miller
*Assistant Examiner*—T. Cunningham
*Attorney, Agent, or Firm*—Oblon, Spivak, McClelland, Maier & Neustadt

[57] ABSTRACT

Respective current supply means ($I_A$, $I_B$) control conducting periods of corresponding transistors ($Q_3$, $Q_4$), whereby conducting periods of driving transistore ($Q_6$, $Q_7$) are also controlled. Thus, periods in which both of the driving transistors ($Q_6$, $Q_7$) simultaneously enter ON states are reduced and through current ($I_S$) flowing to the ground level GND through the driving transistors ($Q_6$, $Q_7$) is reduced. A pull-down transistor ($Q_8$) controls a conducting period of the driving transistor ($Q_7$), whereby periods in which both of the driving transistors ($Q_6$, $Q_7$) simultaneously enter ON states are reduced and the through current ($I_S$) is reduced.

9 Claims, 9 Drawing Sheets

SWITCHING OUTPUT CIRCUIT WITH HIGH SPEED OPERATION AND LOW POWER CONSUMPTION

BACKGROUND OF THE INVENTION

1. Field of the Invention

The present invention relates to a switching output circuit.

2. Description of the Prior Art

FIG. 1 is a circuit diagram showing a conventional switching circuit which is applied to TTL. An input terminal IN is connected to the base of an NPN transistor $Q_4$. The NPN transistor $Q_4$ has an emitter which is connected to the ground level GND through a resistor $R_1$ and a collector which is connected to an end of a current supply means $I_C$. Another end of the current supply means $I_C$ is connected to a voltage source $V_{CC}$ for supplying power to this circuit. An NPN transistor $Q_5$ has a base which is connected to the collector of the NPN transistor $Q_4$, a collector which is connected to the voltage source $V_{CC}$ and an emitter which is connected to the ground level GND through a resistor $R_2$. An NPN transistor $Q_6$ has a base which is connected to the emitter of the NPN transistor $Q_5$ and a collector which is connected to the voltage source $V_{CC}$. An NPN transistor $Q_7$ has a base which is connected to the emitter of the NPN transistor $Q_4$ and an emitter which is connected to the ground level GND. The emitter of the NPN transistor $Q_6$ and the collector of the NPN transistor $Q_7$ are commonly connected to an output terminal OUT.

The operation of this circuit is now described. When voltage $V_{BE(OFF)}$ (voltage across base and emitter for bringing the NPN transistor $Q_4$ into an OFF state) is applied to the input terminal IN, the NPN transistors $Q_4$ and $Q_7$ enter OFF states and the NPN transistors $Q_5$ and $Q_6$ enter ON states while the level of the output terminal OUT goes high level.

When voltage $V_{BE(ON)}$ (voltage across base and emitter for bringing the NPN transistor $Q_4$ into an ON state) is applied to the input terminal IN, on the other hand, the NPN transistors $Q_4$ and $Q_7$ enter ON states and the NPN transistors $Q_5$ and $Q_6$ enter OFF states while the level of the output terminal OUT goes low level.

FIG. 2 is a timing chart showing waveforms of voltage at the input terminal IN, ON/OFF states of the NPN transistors $Q_7$ and $Q_6$ and through current $I_S$ flowing from the voltage source $V_{CC}$ the ground level GND through the NPN transistors $Q_6$ and $Q_7$ in the case of alternately applying the voltage $V_{BE(ON)}$ and the voltage $V_{BE(OFF)}$ to the input terminal IN.

When the voltage applied to the input terminal IN is changed from $V_{BE(OFF)}$ to $V_{BE(ON)}$, the NPN transistor $Q_7$ is converted from an OFF state to an ON state while the NPN transistor $Q_6$ is converted from an ON state to an OFF state. When a general transistor is converted from an ON state to an OFF state, a delay time is caused due to charges stored in its base. The resistors $R_1$ and $R_2$ are added in order to discharge such base storage charges. Power consumption is increased when the resistance values of the resistors $R_1$ and $R_2$ are reduced, while delay times are increased when the resistance values are increased.

Referring to the timing chart shown in FIG. 2, the NPN transistor $Q_6$ enters a conducting state for a while due to such a delay time after the voltage at the input terminal IN is changed from $V_{BE(OFF)}$ to $V_{BE(ON)}$. The through current $I_S$ flows from the voltage source $V_{CC}$ to the ground level GND through the NPN transistors $Q_6$ and $Q_7$. Similarly, the NPN transistor $Q_7$ enters a conducting state for a while after the applied voltage to the input terminal IN is changed from $V_{BE(ON)}$ to $V_{BE(OFF)}$, and the through current $I_S$ flows. The through current $I_S$ is further increased in proportion to the number of switching times when high-speed operation is performed.

In the conventional switching output circuit having the aforementioned structure, power consumption is increased by the through current $I_S$ and further increased in high-speed operation.

SUMMARY OF THE INVENTION

In the first aspect, a switching output circuit according to the present invention comprises first and second power supply lines one of which supplies a relatively high potential and the other of which supplies a relatively low potential, first, second and third current supply means connected to the first power supply line, an input terminal, a first transistor having a base connected to the input terminal, an emitter connected to the second power supply line and a collector connected to the first current supply means, a second transistor having a base connected to the input terminal, an emitter connected to the second power supply line and a collector connected to the second current supply means;

a third transistor having a base connected to the collector of the first transistor and an emitter connected to the second power supply line, a fourth transistor having a base connected to the collector of the second transistor and a collector connected to the third current supply means, a fifth transistor having a base connected to the collector of the fourth transistor, an emitter connected to the collector of the third transistor and a collector connected to the first power supply line, a sixth transistor having a base connected to the emitter of the fifth transistor and a collector connected to the first power supply line, a seventh transistor having a base connected to the emitter of the fourth transistor and an emitter connected to the second power supply line, and an output terminal commonly connected to the emitter of the sixth transistor and the collector of the seventh transistor.

In the second aspect, a switching output circuit according to the present invention comprises first and second power supply lines one of which supplies a relatively high potential and the other of which supplies a relatively low potential, first, second and third current supply means connected to the first power supply line, an input terminal, a first transistor having a base connected to the input terminal, an emitter connected to the second power supply line and a collector connected to the first current supply means, a second transistor having a base connected to the input terminal, an emitter connected to the second power supply line and a collector connected to the second current supply means, a third transistor having a base connected to the collector of the first transistor and an emitter connected to the second power supply line, fourth transistor having a base connected to the collector of the second transistor and a collector connected to the third current supply means, a fifth transistor having a base connected to the collector of the fourth transistor, an emitter connected to the collector of the third transistor and a collector connected to the first power supply line, a sixth transistor having a base connected to the emitter of the fifth transistor and a collector connected to the first power supply line, a seventh transistor having a base connected to the emitter of the fourth transistor and an emitter connected to the second power supply line, turn-off facilitating means connected between the base of the seventh transistor and the second power supply line for performing charging or discharging with respect to the base of the seventh transistor in order to hasten timing when the seventh transistor becomes a nonconducting state, at the time of turn-off time of the seventh transistor, and an output terminal commonly connected to the emitter of the sixth transistor and the collector of the seventh transistor.

According to the present invention, first and second current supply means control conducting and nonconducting times of third and fourth transistors to reduce periods in which sixth and seventh transistors simultaneously enter conducting states.

Accordingly, an object of the present invention is to obtain a switching output circuit which causes substantially no through current even if switching operation is performed at a high speed, thereby to suppress power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
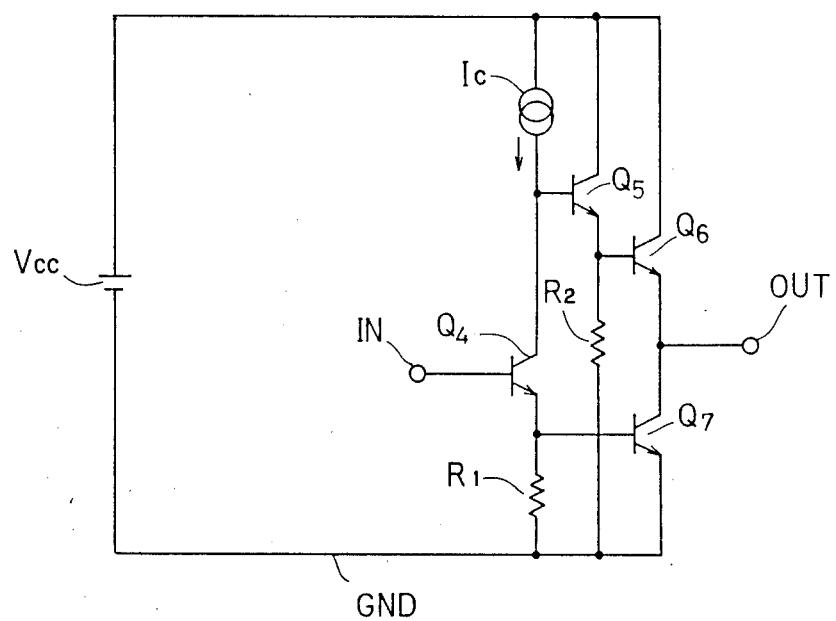
FIG. 1 is a circuit diagram showing a conventional switching output circuit.
Figure 2:
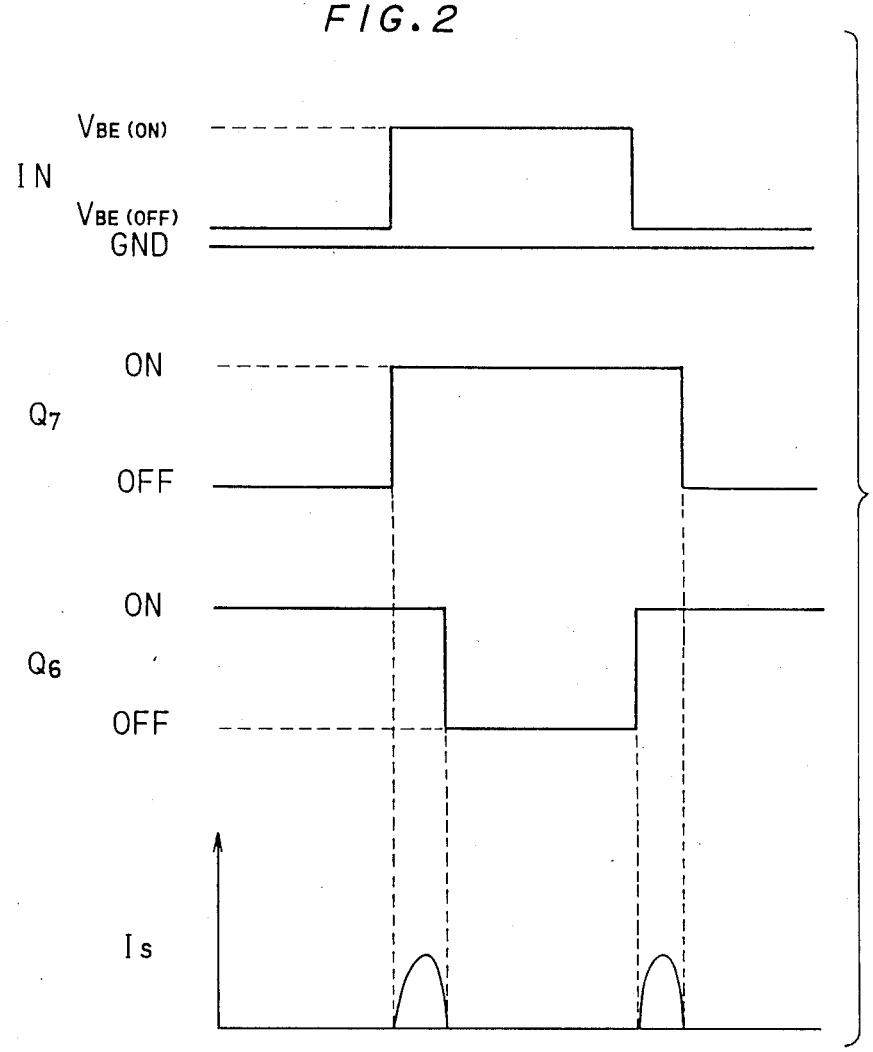
FIG. 2 is a timing chart showing waveforms of respective parts of the switching circuit shown in FIG. 1.
Figure 3:
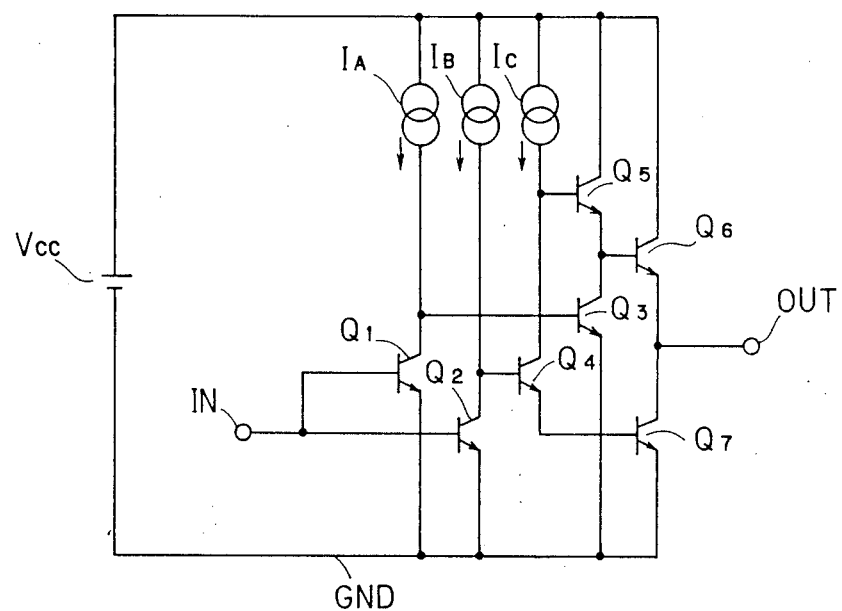
FIG. 3 is a circuit diagram showing a switching output circuit according to an embodiment of the present invention.

Embodiments of the present invention will now be described with reference to the accompanying drawings. FIG. 3 is a circuit diagram showing a switching output circuit according to an embodiment of the present invention. An input terminal IN is commonly connected to bases of NPN transistors $Q_1$ and $Q_2$. Emitters of the NPN transistors $Q_1$ and $Q_2$ are connected to the ground level GND. The collector of the NPN transistor $Q_1$ is connected to an end of a current supply means $I_A$ which is formed by a constant current source, while the collector of the the NPN transistor $Q_2$ is connected to an end of another current supply means $I_B$, which is formed by a constant current source. Other ends of the current supply means $I_A$ and $I_B$ are connected to a voltage source $V_{CC}$. An NPN transistor $Q_3$ has a base which is connected to the collector of the NPN transistor $Q_1$, and an emitter which is connected to the ground level GND. An NPN transistor $Q_4$ has a base which is connected to the collector of the NPN transistor $Q_2$, an emitter which is connected to the base of an NPN transistor $Q_7$ and a collector which is connected to an end of still another current supply means $I_C$ formed by a constant current source. The other end of the current supply means $I_C$ is connected to the voltage source $V_{CC}$. An NPN transistor $Q_5$ has a base which is connected to the collector of the NPN transistor $Q_4$, an emitter which is connected to the collector of the NPN transistor $Q_3$ and a collector which is connected to the voltage source $V_{CC}$. An NPN transistor $Q_6$ has a base which is connected to the emitter of the NPN transistor $Q_5$ and a collector which is connected to the voltage source $V_{CC}$. The NPN transistor $Q_7$ has a base which is connected to the emitter of the NPN transistor $Q_4$ and an emitter which is connected to the ground level GND. The emitter of the NPN transistor $Q_6$ and the collector of the NPN transistor $Q_7$ are commonly connected to an output terminal OUT.

The operation of this circuit will now be described. When voltage $V_{BE(OFF)}$ (voltage across base and emitter for bringing the NPN transistors $Q_1$ and $Q_2$ into OFF states) is applied to the input terminal IN, the NPN transistors $Q_1$ and $Q_2$ enter OFF states and the NPN transistors $Q_3$, $Q_4$ and $Q_7$ enter ON states, while the NPN transistors $Q_5$ and $Q_6$ enter OFF states and the level of the output terminal OUT goes low level.

When voltage $V_{BE(ON)}$ (voltage across base and emitter for bringing the NPN transistors $Q_1$ and $Q_2$ into ON states) is applied to the input terminal IN, on the other hand, the NPN transistors $Q_1$ and $Q_2$ enter ON states and the NPN transistors $Q_3$, $Q_4$ and $Q_7$ enter OFF states while the NPN transistors $Q_5$ and $Q_6$ enter ON states and the level of the output terminal OUT goes high level.

Figure 4:
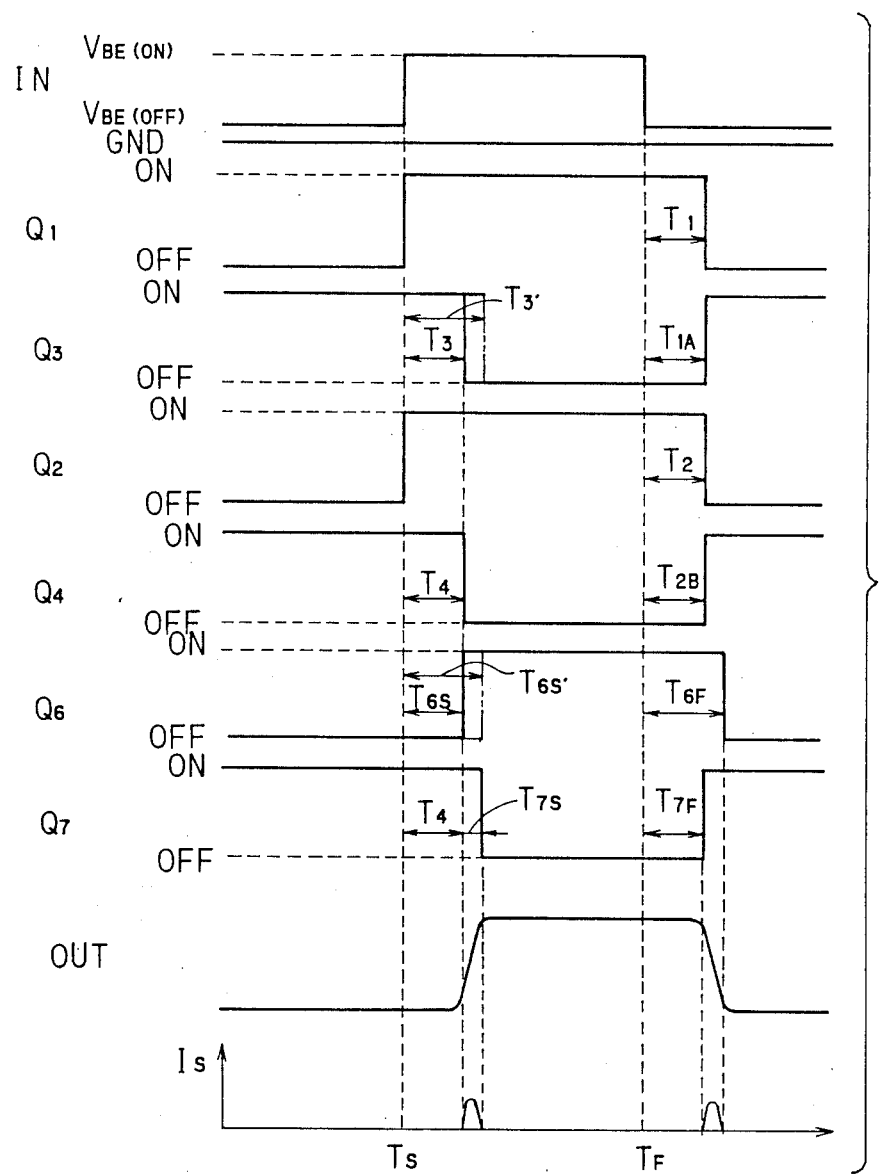
FIG. 4 is a timing chart showing waveforms of respective parts of the switching output circuit shown in FIG. 3.

FIG. 4 is a timing chart showing waveforms of voltage at the input terminal IN, ON/OFF states of the NPN transistors $Q_1$, $Q_2$, $Q_3$, $Q_4$, $Q_6$ and $Q_7$, voltage at the output terminal OUT and through current $I_S$ flowing from the voltage source $V_{CC}$ to the ground level GND through the NPN transistors $Q_6$ and $Q_7$ in the case of alternately applying the voltage $V_{BE(ON)}$ and the voltage $V_{BE(OFF)}$ to the input terminal IN.

When a general transistor is converted from an OFF state to an ON state, a delay time is caused due to charges stored in its base. FIG. 4 shows the states of the respective transistors in consideration of only delay times caused when the transistors are converted from ON states to OFF states, while neglecting those caused when the transistors are converted from OFF states to ON states.

The voltage applied to the input terminal IN is changed from $V_{BE(OFF)}$ to $V_{BE(ON)}$ at a time $T_S$, and from $V_{BE(ON)}$ to $V_{BE(OFF)}$ at a time $T_F$. The NPN transistor $Q_1$ is converted from an OFF state to an ON state at the time $T_S$, and further converted from the ON state to an OFF state after a lapse of a delay time $T_1$ from the time $T_F$. The transistor $Q_3$ is converted from an ON state to an OFF state after a lapse of a delay time $T_3$ from the time $T_S$, and further converted from the OFF state to an ON state after a lapse of a delay time $T_{1A}$, which is slightly longer than the delay time $T_1$, from the time $T_F$.

Similarly to the NPN transistor $Q_1$, the NPN transistor $Q_2$ is converted from an OFF state to an ON state at the time $T_S$, and further converted from the ON state to an OFF state after a lapse of a delay time $T_2$ from the time $T_F$. Similarly to the NPN transistor $Q_3$, the NPN transistor $Q_4$ is converted from an ON state to an OFF state after a lapse of a delay time $T_4$ from the time $T_S$, and further converted from the OFF state to an ON state after a lapse of a delay time $T_{2B}$, which is slightly longer than the delay time $T_2$, from the time $T_F$.

The NPN transistors $Q_5$ and $Q_6$ are connected in Darlington-connection. When the NPN transistor $Q_4$ is in an ON state, the base potential of the NPN transistor $Q_5$ goes low level and then both of the NPN transistors $Q_5$ and $Q_6$ enter OFF states. When the NPN transistor $Q_3$ enters an ON state, the base potential of the NPN transistor $Q_6$ goes low level and the NPN transistor $Q_6$ enters an OFF state. That is, the NPN transistor $Q_6$ is converted from an OFF state to an ON state after a lapse of a delay time $T_{6S}$, which is substantially equal to the longer one of the delay times $T_3$ and $T_4$, from the time $T_S$. The NPN transistor $Q_6$ is converted from an ON state to an OFF state after a lapse of a delay time $T_{6F}$, which is determined in relation to the shorter one of the delay times $T_{1A}$ and $T_{2B}$, from the time $T_F$. This delay time $T_{6F}$, includes the intrinsic delay time of the NPN transistor $Q_6$.

The NPN transistor $Q_7$ is converted from an ON state to an OFF state after a lapse of a delay time, which is provided by the sum of the delay time $T_4$ and a delay time $T_{7S}$, from the time $T_S$. The delay time $T_{7S}$ is required for discharging the charges stored in the base of the NPN transistor $Q_7$, and is related to junction capacity between the base and emitter of the NPN transistor $Q_7$. The NPN transistor $Q_7$ is further converted from the OFF state to an ON state after a lapse of a delay time $T_{7F}$ from the time $T_F$. Since the NPN transistor $Q_7$ is not converted to an ON state during when the NPN transistor $Q_4$ is in an OFF state, the delay time $T_{7F}$ is substantially equal to the delay time $T_{2B}$.

The level of the output terminal OUT is determined by ON/OFF states of the NPN transistors $Q_6$ and $Q_7$. While both of the NPN transistors $Q_6$ and $Q_7$ are in ON states in an interval between a time $T_S + T_{6S}$ and a time $T_S + T_4 + T_{7S}$ on the timing chart, the same are in transient states including short periods preceding and following this interval in practice, and the level of the output terminal OUT is increased in this interval and converted from a low-level state to a high-level state. In a similar manner, the level of the output terminal OUT is reduced and converted from the high-level state to a low-level state in an interval between a time $T_F + T_{7F}$ and a time $T_F + T_{6F}$.

Referring to FIG. 4, therefore, there are periods in which both of the NPN transistors $Q_6$ and $Q_7$ enter ON states in the interval between the times $T_S + T_{6S}$ and $T_S + T_4 + T_{7S}$ and the interval between the times $T_F + T_{7F}$ and $T_F + T_{6F}$. Thus, through current $I_S$ is caused to flow from the voltage source $V_{CC}$ to the ground level GND through the NPN transistors $Q_6$ and $Q_7$, while such periods are relatively short and the through current $I_S$ is reduced as compared with the conventional switching output circuit.

According to this embodiment, the through current $I_S$ can be further reduced by adjusting ON/OFF timings of the NPN transistors $Q_6$ and $Q_7$ in a manner that one of the NPN transistors $Q_6$ and $Q_7$ enters a transient state from an ON state to an OFF state or from an OFF state to an ON state while another transistor is in an OFF state so that the conditions of $T_{6S} > T_4 + T_{7S}$ and $T_{6F} < T_{7F}$ in FIG. 4 are satisfied, by increasing supply current of the current supply means $I_4$.

When the current from the current supply means $I_4$ is increased, the base current of the NPN transistor $Q_3$ is increased and the amount of charges stored in its base is increased, whereby the delay time $T_3$ is increased as a delay time $T_3'$ when the NPN transistor $Q_3$ is converted from an ON state to an OFF state. Therefore, the delay time $T_{6S}$ of the NPN transistor $Q_6$ is also increased as a delay time $T_{6S}'$. Consequently, the condition $T_{6S} > T_4 + T_{7S}$ is satisfied and the through current $I_S$ is minimized.

When the NPN transistor $Q_3$ is converted from an OFF state to an ON state, the speed for raising up its base potential is increased and the delay time $T_{1A}$ is further reduced. Therefore, the base of the NPN transistor $Q_6$ is forced to be shorted to the ground level GND at a higher speed by the NPN transistor $Q_3$, whereby the delay time $T_{6F}$ is also reduced. Consequently, the condition $T_{6F} < T_{7F}$ is satisfied and the through current $I_S$ is minimized.

Assuming that the ON/OFF timing of the NPN transistor $Q_7$ is constant, the timing for bringing the NPN transistor $Q_6$ into an ON state can be retarded and that for brining the same into an OFF state can be advanced by increasing the current of the current supply means $I_4$, whereby the through current $I_S$ can be further reduced. In this case, the current of the current supply means $I_4$ may be set to be larger than those of the current supply means $I_B$ and $I_C$.

Figure 5:
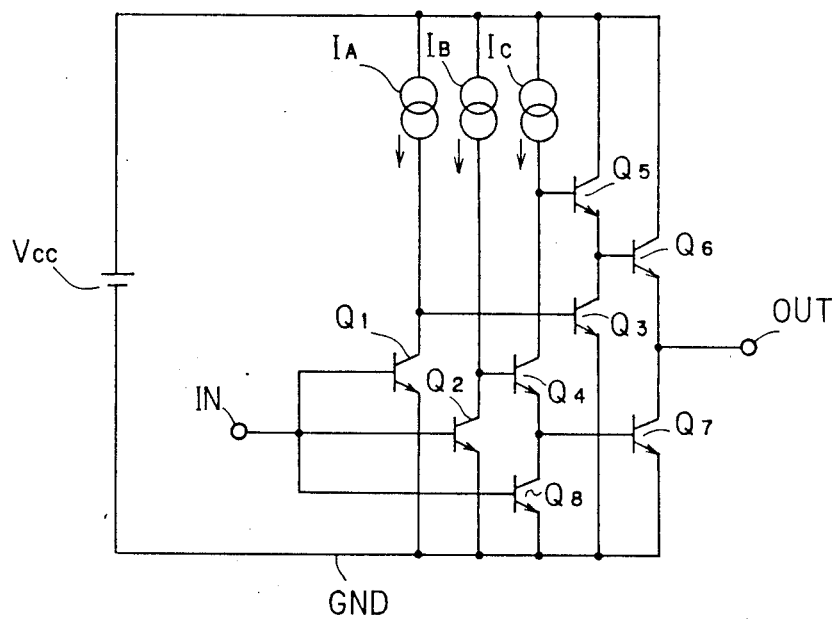
FIG. 5 is a circuit diagram showing a switching output circuit according to another embodiment of the present invention.

FIG. 5 is a circuit diagram showing a switching output circuit according to another embodiment of the present invention. In this embodiment, an NPN transistor $Q_8$ is provided in order to facilitate turn-off operation of an NPN transistor $Q_7$. The NPN transistor $Q_8$ has a base which is connected to an input terminal IN, an emitter which is connected to the ground level GND and a collector which is connected to the base of the NPN transistor $Q_7$. Other structure of this embodiment is similar to that of the switching output circuit shown in FIG. 3.

The operation of this circuit is now described. When voltage $V_{BE(OFF)}$ (voltage across base and emitter for bringing NPN transistors $Q_1$, $Q_2$ and $Q_8$ into OFF states) is applied to the input terminal IN, the NPN transistors $Q_1$, $Q_2$ and $Q_8$ enter OFF states and NPN transistors $Q_3$, $Q_4$, and $Q_7$ enter ON states while NPN transistors $Q_5$ and $Q_6$ enter OFF states and the level of the output terminal OUT goes low level.

When voltage $V_{BE(ON)}$ (voltage across base and emitter for bringing the NPN transistors $Q_1$, $Q_2$ and $Q_8$ into ON states) is applied to the input terminal IN, on the other hand, the NPN transistors $Q_1$, $Q_2$ and $Q_8$ enter ON states and the NPN transistors $Q_3$, $Q_4$ and $Q_7$ enter OFF states, while the NPN transistors $Q_5$ and $Q_6$ enter ON states and the level of the output terminal OUT goes high level.

Figure 6:
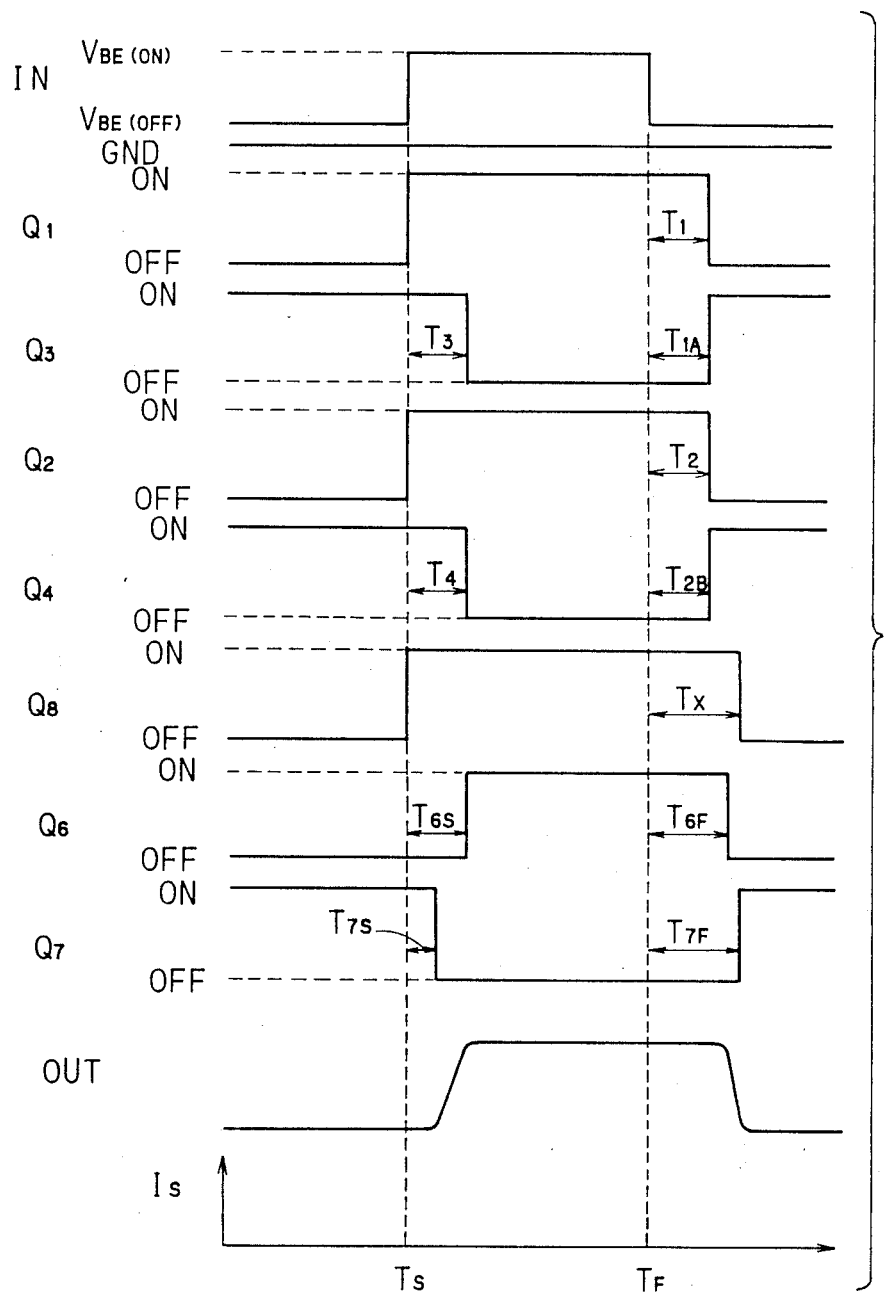
FIG. 6 is a timing chart showing waveforms of respective parts of the switching output circuit shown in FIG. 5.

FIG. 6 is a timing chart showing waveforms of voltage at the input terminal IN, ON/OFF states of the NPN transistors $Q_1$, $Q_2$, $Q_3$, $Q_4$, $Q_6$, $Q_7$ and $Q_8$, voltage at the output terminal OUT and through current $I_S$ flowing from a voltage source $V_{CC}$ to the ground level GND through the NPN transistors $Q_6$ and $Q_7$ in the case of alternately applying the voltage $V_{BE(ON)}$ and the voltage $V_{BE(OFF)}$ to the input terminal IN.

FIG. 6 shows the states of the respective transistors in consideration of delay times caused when the transistors are converted from ON states to OFF states while neglecting those caused when the transistors are converted from OFF states to ON states, similarly to FIG. 4.

The voltage applied to the input terminal IN is changed from $V_{BE(OFF)}$ to $V_{BE(ON)}$ at a time $T_S$ and from $V_{BE(ON)}$ to $V_{BE(OFF)}$ at a time $T_F$. The NPN transistor $Q_1$ is converted from an OFF state to an ON state at the time $T_S$, and further converted from the ON state to an OFF state after a lapse of a delay time $T_1$ from the time $T_F$. The NPN transistor $Q_3$ is converted from an ON state to an OFF state after a lapse of a delay time $T_3$ from the time $T_S$, and further converted from the OFF state to an ON state after a lapse of a delay time $T_{1A}$, which is slightly longer than the delay time $T_1$, from the time $T_F$.

Similarly to the NPN transistor $Q_1$, the NPN transistor $Q_2$ is converted from an OFF state to an ON state at the time $T_S$, and further converted from the ON state to an OFF state after a lapse of a delay time $T_2$ from the time $T_F$. Similarly to the NPN transistor $Q_3$, the NPN transistor $Q_4$ is converted from an ON state to an OFF state after a lapse of a delay time $T_4$ from the time $T_S$, and is further converted from the OFF state to an ON state after a lapse of a delay time $T_{2B}$, which is slightly longer than the delay time $T_2$, from the time $T_F$.

The NPN transistor $Q_8$ is converted from an OFF state to an ON state at the time $T_S$, and is further converted from the ON state to an OFF state after a lapse of a delay time $T_X$ from the time $T_F$. This delay time $T_X$ can be adjusted through the size, structure etc. of the NPN transistor $Q_8$, as hereinafter described.

The NPN transistors $Q_5$ and $Q_6$ are connected in Darlington-connection. When the NPN transistor $Q_4$ is in an ON state, the base potential of the NPN transistor $Q_5$ goes low level and then both of the NPN transistors $Q_5$ and $Q_6$ enter OFF states. When the NPN transistor $Q_3$ enters an ON state, the base potential of the NPN transistor $Q_6$ goes low level and the NPN transistor $Q_6$ enters an OFF state. That is, the NPN transistor $Q_6$ is converted from an OFF state to an ON state after a lapse of a delay time $T_{6S}$, which is substantially equal to the longer one of the delay times $T_3$ and $T_4$, from the time $T_S$. Further, the NPN transistor $Q_6$ is converted from an ON state to an OFF state after a lapse of a delay time $T_{6F}$, which is determined in relation to the shorter one of the delay times $T_{1A}$ and $T_{2B}$, from the time $T_F$. The delay time $T_{6F}$ includes the intrinsic delay time of the NPN transistor $Q_6$.

The NPN transistor $Q_7$ is converted from an ON state to an OFF state after a lapse of a delay time $T_{7S}$ from the time $T_S$. This delay time $T_{7S}$ is required in order to discharge charges stored in the base of the NPN transistor $Q_7$, and is related to the junction capacity between the base and emitter of the NPN transistor $Q_7$ and ON-state resistance of the NPN transistor $Q_8$. This delay time $T_{7S}$ can be adjusted through the size, structure etc. of the NPN transistor $Q_8$, as hereinafter described. The NPN transistor $Q_7$ is further converted from the OFF state to an ON state after a lapse of a delay time $T_{7F}$ from the time $T_F$. Since the NPN transistor $Q_7$ is not converted to an ON state during when the NPN transistor $Q_8$ is in an ON state and the NPN transistor $Q_4$ is in an OFF state, the delay time $T_{7F}$ is substantially equal to the longer one of the delay time $T_{2B}$ and $T_X$.

The level of the output terminal OUT is determined by ON/OFF states of the NPN transistors $Q_6$ and $Q_7$. While both of the NPN transistors $Q_6$ and $Q_7$ are in OFF states in an interval between a time $T_S + T_{7S}$ and a time $T_S + T_{6S}$ on the timing chart, the same are in transient states in practice and the level of the output terminal OUT is increased in this interval and converted from a low-level state to a high-level state. Similarly, the level of the output terminal OUT is reduced in an interval between a time $T_F + T_{6F}$ and a time $T_F + T_{7F}$ and converted from a high-level state to a low-level state.

According to this embodiment, the circuit is so structured that there is no period when both of the NPN transistors $Q_6$ and $Q_7$ enter completely conducting states. A method of such adjustment is described below. Thus, the through current $I_S$ flowing from the voltage source $V_{CC}$ to the ground level GND through the NPN transistors $Q_6$ and $Q_7$ is minimized.

The state of minimizing the through current $I_S$ is maintained if one of the NPN transistors $Q_6$ and $Q_7$ enters a transient state from an ON state to an OFF state or vice versa during when another transistor is in an OFF state. That is, $T_{6S}$ may be greater than $T_{7S}$ and $T_{7F}$ may be greater than $T_{6F}$ in FIG. 6. The through current minimizing state is stabilized as the difference between the delay times is increased.

Description is now made on a method of increasing the difference between the delay times $T_{6S}$ and $T_{7S}$ and that between $T_{6F}$ and $T_{7F}$ for stabilizing the through current minimizing state. If current from a current supply means $I_A$ is increased, the speed for raising up the base potential of the NPN transistor $Q_3$ is increased and the delay time $T_{1A}$ is reduced when the NPN transistor $Q_3$ is converted from an OFF state to an ON state. When the same is converted from an ON state to an OFF state, on the other hand, the delay time $T_3$ is increased since the amount of charges stored in the base of the NPN transistor $Q_3$ is increased. Thus, the NPN transistor $Q_6$ is so influenced that the timing for bringing the same into an ON state is retarded ($T_{6S}$ is increased) while that for bringing the same into an OFF state is advanced ($T_{6F}$ is reduced).

When current from a current supply means $I_B$ is increased, timing for bringing the NPN transistor $Q_4$ into an ON state is advanced ($T_{2B}$ is reduced) and that for bringing the same into an OFF state is retarded ($T_4$ is increased). Thus, the timings for bringing the NPN transistors $Q_5$ and $Q_6$ into ON states are retarded and those for bringing the same into OFF states are advanced. That is, the delay time $T_{6S}$ is increased and the delay time $T_{6F}$ is reduced as to the NPN transistor $Q_6$.

In any case, the timing for bringing the NPN transistor $Q_6$ into an ON state is retarded and that for bringing the same into an OFF state is advanced assuming that ON/OFF timing of the NPN transistor $Q_7$ is constant, whereby the through current minimizing state can be easily maintained.

The through current minimizing state can also be stabilized without increasing the current quantities of the current supply means $I_A$ and $I_B$ or by changing the size and structure of the NPN transistor $Q_8$ in addition to increase in the said current quantities.

Figure 7:
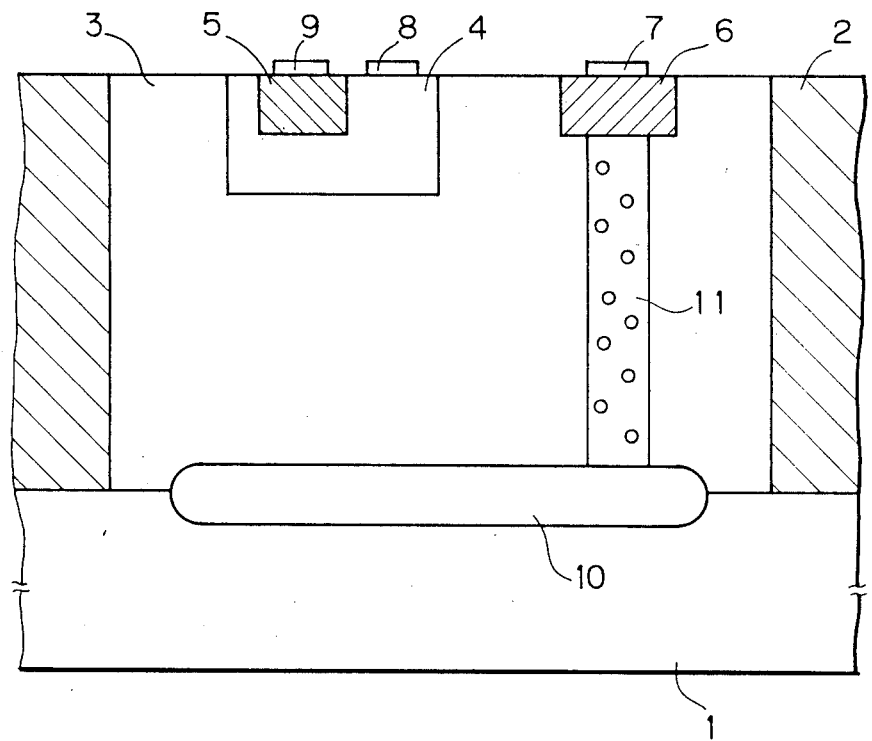
FIG. 7 is a sectional view showing the structure of a transistor to which a collector wall is applied.

FIG. 7 is a sectional view showing exemplary structure of the NPN transistor $Q_8$. Referring to FIG. 7, a substrate 1, an isolation region 2, a collector layer 3, a base region 4, an emitter region 5, a collector diffusion layer 6, a collector electrode 7, a base electrode 8 and an emitter electrode 9 form an ordinary transistor. Further, a layer 10, which is buried between the substrate 1 and the collector layer 3 and has high impurity concentration, and the collector electrode 7 are connected with each other by a layer (collector wall diffusion layer 11) which is higher in impurity concentration than the collector layer 3. According to such structure, the timing for bringing the NPN transistor $Q_8$ into an OFF state is retarded since the amount of base storage charges is increased while the timing for bringing the NPN transistor $Q_7$ into an OFF state is advanced since equivalent resistance across collector and emitter in an ON state is reduced. Assuming that ON/OFF state timing of the NPN transistor $Q_6$ is constant, the timing for bringing the NPN transistor $Q_7$ into an ON state is retarded and that for bringing the same into an OFF state is advanced, whereby the through current minimizing state can be easily maintained.

According to this structure, further, the base storage charges are increased when the temperature is raised up while the former are reduced when the latter is lowered. That is, the timing for bringing the NPN transistor $Q_8$ into an OFF state is retarded and that for bringinging the same into an ON state is advanced when the temperature is raised up. Thus, the through current is further reduced to suppress heat generation over the entire chip.

When a junction area between base and emitter is increased by increasing the size of the NPN transistor $Q_8$, on the other hand, equivalent resistance across collector and emitter in an ON state is so reduced that the base storage charges of the NPN transistor $Q_7$ can be further quickly discharged. Thus, the delay time $T_{7S}$ is reduced and the timing for bringing the NPN transistor $Q_7$ into an OFF state is advanced.

Further, parasitic capacity such as junction capacity between base and emitter, junction capacity between collector and base and junction capacity between collector and substrate are increased in response to the increased size, whereby the timing for bringing the NPN transistor $Q_8$ into an OFF state is retarded. Thus, the delay times $T_X$ and $T_{7F}$ are increased and the timing for bringing the NPN transistor $Q_7$ into an ON state is retarded. Assuming that ON/OFF timing of the NPN transistor $Q_6$ is constant, the timing for bringing the NPN transistor $Q_7$ into an ON state is retarded and that for bringing the same into an OFF state is advanced, whereby the through current minimizing state can be easily maintained.

As hereinabove described, the through current minimizing state can be easily maintained by increasing the current values at the current supply means $I_A$ and $I_B$ and appropriately changing the size and structure of the NPN transistor $Q_8$. Such adjustment can be independently or arbitrarily combinedly applied to the switching output circuit in order to attain a synergetic effect, thereby to further easily maintain the through current minimizing state.

The through current $I_S$ slightly flows also in periods when both of the NPN transistors $Q_6$ and $Q_7$ enter OFF states in practice and hence the effect cannot be attained if such periods are too long. However, the length of such periods can be optimized to minimize the through current $I_S$ by performing the aforementioned adjustment.

Figure 8:
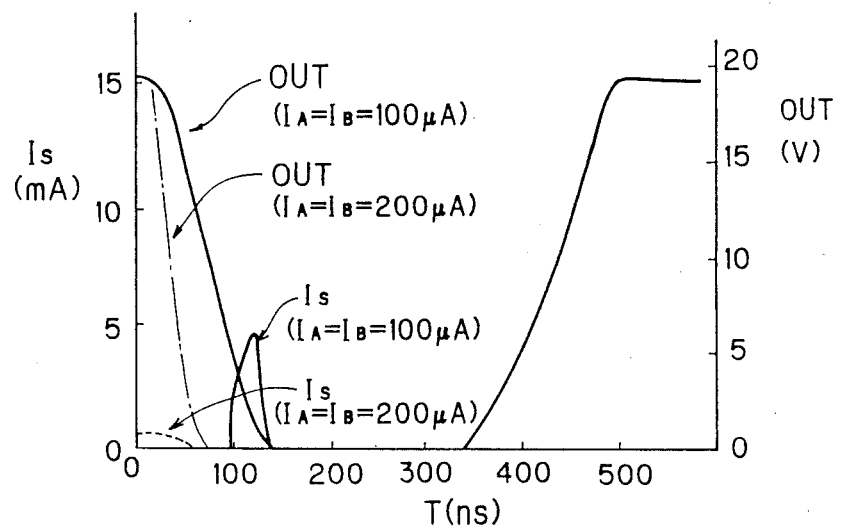
FIGS. 8 and 9 are timing charts showing changes in output voltage and through current.

FIG. 8 is a graph showing relation between time T, the level of the output terminal OUT and through current $I_S$ after change in input IN with parameters of current $I_A$ and current $I_B$. The through current $I_S$ is extremely reduced when the current $I_A$ and the current $I_B$ are increased.

Figure 9:
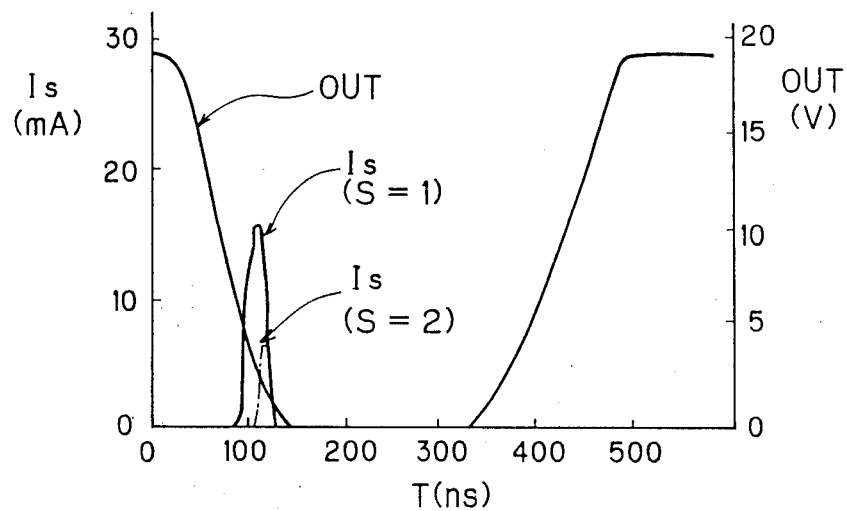

FIG. 9 is a graph showing relation between time T, the level of the output terminal OUT and through current $I_S$ after change in input IN with a parameter of a junction area S between base and emitter of the NPN transistor $Q_8$. The through current $I_S$ is extremely reduced when the junction area S is increased.

Figure 10:
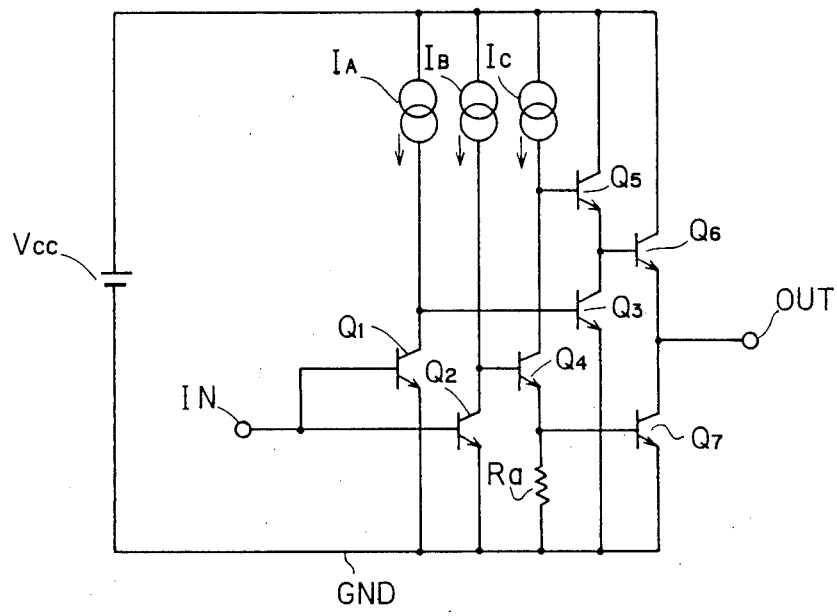
FIG. 10 is a circuit diagram showing a switching output circuit according to still another embodiment of the present invention.

FIG. 10 is a circuit diagram showing a switching output circuit according to still another embodiment of the present invention. According to this embodiment, the NPN transistor $Q_8$ shown in FIG. 5 is replaced by a resistor $R_a$ which is connected between the base and the emitter of an NPN transistor $Q_7$ as turn-off facilitating means for discharging charges from the base of the NPN transistor $Q_7$ in order to advance the timing for bringing the NPN transistor $Q_7$ into a OFF state when the same is turned off. However, although the discharge time for the charges stored in the base of the NPN transistor $Q_7$ can be adjusted by controlling base voltage thereof when the NPN transistor $Q_8$ is employed, the discharge time is constant when the resistor $R_a$ is employed.

Although the circuit is formed by NPN transistors in each of the aforementioned embodiments, the same can also be formed by PNP transistors or combination of NPN and PNP transistors. When PNP transistors are employed, turn-off facilitating means formed by the transistor $Q_8$ or the resistor $R_a$ is adapted to charge base charges in the transistor $Q_7$.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A switching output circuit comprising:
   first and second power supply lines one of which supplies a relatively high potential and the other of which supplies a relatively low potential;
   first, second and third current supply means connected to said first power supply line;
   an input terminal;
   a first transistor having a base connected to said input terminal, an emitter connected to said second power supply line and a collector connected to said first current supply means;
   a second transistor having a base connected to said input terminal, an emitter connected to said second power supply line and a collector connected to said second current supply means;
   a third transistor having a base connected to said collector of said first transistor and an emitter connected to said second power supply line;
   a fourth transistor having a base connected to said collector of said second transistor and a collector connected to said third current supply means;
   a fifth transistor having a base connected to said collector of said fourth transistor, an emitter connected to a collector of said third transistor and a collector connected to said first power supply line;

a sixth transistor having a base connected to said emitter of said fifth transistor and a collector connected to said first power supply line;

a seventh transistor having a base connected to an emitter Of said fourth transistor and an emitter connected to said second power supply line; and an output terminal commonly connected to an emitter of said sixth transistor and a collector of said seventh transistor.

2. A switching output circuit in accordance with claim 1, wherein supply current of said first current supply means is larger than those of said second and third current supply means.

3. A switching output circuit comprising:

first and second power supply lines one of which supplies a relatively high potential and the other of which supplies a relatively low potential;

first, second and third current supply means connected to said first power supply line;

an input terminal;

a first transistor having a base connected to said input terminal, an emitter connected to said second power supply line and a collector connected to said first current supply means;

a second transistor having a base connected to said input terminal, an emitter connected to said second power supply line and a collector connected to said second current supply means;

a third transistor having a base connected to said collector of said first transistor and an emitter connected to said second power supply line;

a fourth transistor having a base connected to said collector of said second transistor and a collector connected to said third current supply means;

a fifth transistor having a base connected to said collector of said fourth transistor, an emitter connected to a collector of said third transistor and a collector connected to said first power supply line;

a sixth transistor having a base connected to said emitter of said fifth transistor and a collector connected to said first power supply line;

a seventh transistor having a base connected to an emitter of said fourth transistor and an emitter connected to said second power supply line;

turn-off facilitating means connected between said base of said seventh transistor and said second power supply line for performing charging or discharging with respect to said base of said seventh transistor in order to speed up turn-off time of said seventh transistor; and an output terminal commonly connected to an emitter of said sixth transistor and a collector of said seventh transistor.

4. A switching output circuit in accordance with claim 3, wherein said turn-off facilitating means includes an eighth transistor which has a base connected to said input terminal, an emitter connected to said second power supply line and a collector connected to said base of said seventh transistor.

5. A switching output circuit in accordance with claim 4, wherein said eighth transistor has a collector wall diffusion layer.

6. A switching output circuit in accordance with claim 3, wherein said turn-off facilitating means includes a resistor connected across the base of said seventh transistor and said second power supply line.

7. A switching output circuit in accordance with claim 3, wherein said relatively high and low potentials correspond to power source and ground potentials, respectively.

8. A switching output circuit in accordance with claim 7, wherein said first to eighth transistors include NPN transistors.

9. A switching output circuit in accordance with claim 7, wherein said switching output circuit is included in an output circuit of a transistor-transistor logic circuit.

* * * * *